United States Patent [19]

Board

[11] 3,836,988

[45] Sept. 17, 1974

[54] SEMICONDUCTOR DEVICES

[75] Inventor: Kenneth Board, Salfords, near Redhill, England

[73] Assignee: U.S. Philips Corporation, New York, N.Y.

[22] Filed: Nov. 19, 1973

[21] Appl. No.: 416,992

[30] Foreign Application Priority Data

Nov. 24, 1973 Great Britain .................... 54388/73

[52] U.S. Cl. .................... 357/3, 331/107 G, 357/69, 357/89, 357/55

[51] Int. Cl. .................... H03b 7/00

[58] Field of Search ....... 317/234 N, 234 L, 234 M, 317/234 V, 235 E, 235 AJ, 235 AM; 331/107 G

[56] References Cited

UNITED STATES PATENTS

| | | | |
|---|---|---|---|
| 3,377,566 | 4/1968 | Lanza | 317/234 V |
| 3,451,011 | 6/1969 | Uenohara | 317/234 V |
| 3,516,017 | 6/1970 | Kaneko et al. | 317/234 V |
| 3,544,854 | 12/1970 | Cox et al. | 317/234 L |
| 3,566,215 | 2/1971 | Heywang | 317/234 V |
| 3,590,478 | 7/1971 | Takehana | 317/234 N |
| 3,659,160 | 4/1972 | Sloan et al. | 317/235 AJ |
| 3,667,004 | 5/1972 | Kuhn et al. | 317/235 AK |
| 3,673,469 | 6/1972 | Colliver et al. | 317/234 V |
| 3,697,831 | 10/1972 | Anderson et al. | 317/234 V |
| 3,702,947 | 11/1972 | Schilling | 317/235 E |

*Primary Examiner*—Rudolph V. Rolinec
*Assistant Examiner*—William D. Larkins
*Attorney, Agent, or Firm*—Frank R. Trifari; Leon Nigohosian

[57] ABSTRACT

A beam lead contact arrangement for a Gunn diode, having a lightly doped active layer on a heavily doped substrate. One contact connects to the top surface of the active layer, while the other contact is connected to the heavily doped substrate through a hole in the active layer. The second contact also makes contact to the active layer, but current flow is vertical through the layer due to spreading resistance.

9 Claims, 3 Drawing Figures

SEMICONDUCTOR DEVICES

This invention relates to a transferred-electron effect semiconductor device which comprises a semiconductor epitaxial layer on a high conductivity semiconductor substrate of the same conductivity type as and of higher conductivity then the epitaxial layer, a first metallic electrode connection to a first part of the major surface of the epitaxial layer remote from the substrate, an active region of the device which is located in the part of the epitaxial layer between said first electrode connection and the substrate and through which the electron flow, in operation, is transverse to the substrate-epitaxial layer interface.

The expression "metallic" electrode connection is to be understood to mean an electrode connection having metallic conduction. This may be either a metal electrode connection or an electrode connection of metallic conductive material such as for instance heavily doped semiconductor material.

Transferred-electron effect devices are wellknown semiconductor devices suitable for operation at microwave frequencies. They comprise a semiconductor layer having an energy band structure such that when an electric field in excess of a threshold value is produced in a portion of the layer, termed the active region, electrons flowing through that active region transfer from a high-mobility low-mass state to a low-mobility high-mass state. One example of such a transferred-electron effect device is the well-known Gunn effect device in which the electron transfer results in the propagation through the layer of so-called domains of high electric field and corresponding space charge accumulation. In this case, the domain propagation results in high frequency oscillation the frequency of which is determined by the transit time of the domains.

Conventional Gunn effect devices comprise a n-type semiconductor body of gallium-arsenide in the form of a semiconductor epitaxial layer on a high conductivity monocrystalline semiconductor substrate. Electrode connections at opposite major surfaces of the body are made to the substrate and to the epitaxial layer to form the anode and cathode respectively. Gunn effect action occurs in the body across the part of the epitaxial layer between the substrate and the electrode connection to the epitaxial layer, the flow of electron domains being in the direction of thickness of the layer, and transverse to the substrate-epitaxial layer interface. Such a device is termed "longitudinal" Gunn effect device.

It has been proposed to provide the epitaxial-layer electrode-connection of such longitudinal device with a beam-lead electrode terminal portion which protrudes from the semiconductor body across a peripheral portion of the epitaxial layer. Such a beam-lead can be designed and reproducibly made to give specific values of inductance and capacitance for a particular device application and is particularly advantageous when connecting the device in a microwave hybrid integrated circuit. In such a case, it was proposed to mount the semiconductor body substrate on the circuit in a conventional non-beam-leaded manner with its epitaxial layer uppermost. However, such an arrangement has the disadvantage of severely limiting the location of the longitudinal device on or around the integrated circuit substrate.

A less conventional form of Gunn effect device is known comprising a n-type gallium-arsenide layer on a semi-insulating substrate, for example a near intrinsic gallium-arsenide substrate. In this case, the anode and cathode electrode connections are both on the same surface of the epitaxial layer, and Gunn effect action occurs in the body along the part of the layer between the two electrode connections, the flow of electron domains being parallel to the substrate-epitaxial layer interface and transverse to the direction of thickness of the layer. Such a device is termed a coplanar Gunn effect device, and has the disadvantage that the frequency characteristic of the device is determined by the distance parallel to the surface between the two electrode connections, which distance is more difficult to control than the thickness of the epitaxial layer.

The present invention provides a transferred electron effect semiconductor device in which the electron flow, in operation, is transverse to the substrate-epitaxial layer interface but the anode and cathode electrode connections are present at the same surface of the epitaxial layer.

According to the invention, a transferred-electron effect semiconductor device as described in the preamble is characterized in that an aperture is provided in the epitaxial layer extending across the thickness thereof to part of the substrate, and in that a second metallic electrode connection is provided on said part of the substrate at the said aperture, said second electrode connection extending on the epitaxial layer on a second part of the said surface of the epitaxial layer and over the edge of the said aperture, in contact with the epitaxial layer, the thickness of the epitaxial layer being less than the smallest distance between the said first and second electrode connections.

Suprisingly it has been found that although the said second electrode connection is provided at the same surface and in contact with the epitaxial layer and locally bridges said layer, satisfactory transferred-electron effect action can still occur in the active region, between the first electrode connection and the substrate. Thus, there can be provided in a simple manner a longitudinal Gunn effect device having both electrode connections at the same major surface of the semiconductor body. Furthermore, both the first and second electrode connections may be of the same material(s), so that the manufacture can be very simple.

Embodiments of the present invention will now be described, by way of example, with reference to the diagrammatic drawing accompanying the Provisional Specification, in which.

Figure 1:
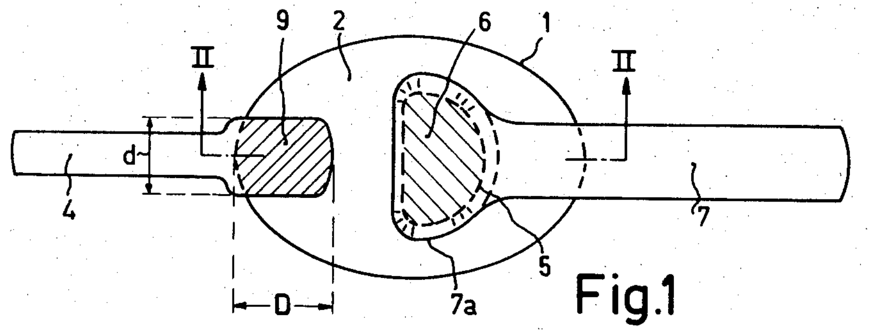
FIG. 1 is a plan view of a beam-leaded Gunn effect device in accordance with the present invention.
Figure 2:
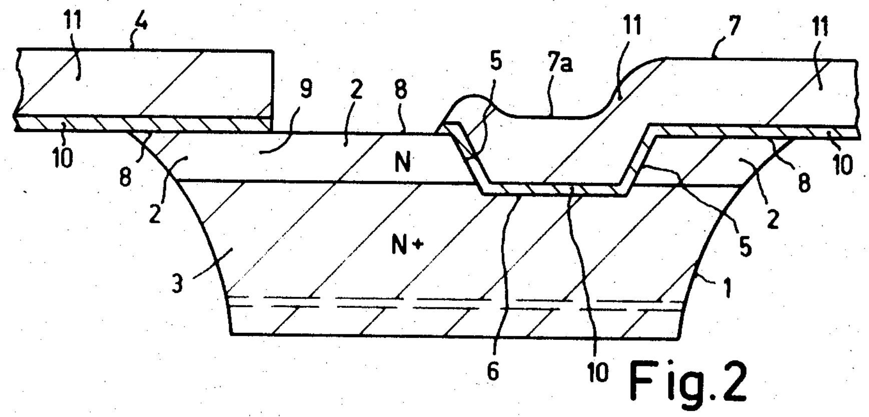
FIG. 2 is a cross-sectional view of the device of FIG. 1 taken on the line II—II of FIG. 1.

The Gunn effect device of FIGS. 1 and 2 comprises a semiconductor body 1 of gallium arsenide material, in the form of an n-type epitaxial layer 2 on a high conductivity n-type substrate 3. For a device suitable for X-band operation, typical values for the thickness and donor doping of the layer 2 and substrate 3 are, for example, 10 microns and $10^{15}$ donor atoms/c.c. and 90 microns and $10^{18}$ donor atoms/c.c. respectively. It should be noted that the thicknesses of device parts shown in FIG. 2 are exaggerated, for clarity, relative to dimensions in the other directions.

A metal-layer cathode electrode 4 forms a low-ohmic contact with part of the major surface 8 of the layer 2 remote from the substrate 3, and shaded in FIG. 1. An aperture 5 is present in the layer 2 and extends across the thickness of the layer 2 to a part 6 of the substrate 3, part 6 is shaded in FIG. 1. The area of this aperture 5 may in a typical case be of the order of $10^3$ sq.microns or larger. A metal-layer anode electrode 7 forms a low-ohmic contact to the part 6 of the substrate at the aperture 5 in the layer 2. This anode electrode 7 extends up and over the edge of the aperture 5 and over another part of the major surface 8 of the epitaxial layer 2, extending away from the cathode electrode 4. The electrode 7 is of the same materials as the electrode 4 and is in both physical and electrical contact with parts of the epitaxial layer 2 at the aperture 5 and at the surface 8. The distance between the cathode and anode electrodes 4 and 7 is greater than that between the anode electrode 4 and the substrate 3. In a typical case, the anode and cathode electrodes 4 and 7 are spaced apart by, for example, about 100 microns. In these circumstances, although electrode 7 is in low-ohmic contact with the epitaxial layer 2, the electrode configuration and the relative conductivities of the substrate 3 and the epitaxial layer 2 ensure that electrode 7 performs as an electrode connection to the substrate 3. In operation, a voltage, typically 10 volts for example, is applied between the cathode and anode electrodes 4 and 7. Practically the entire operating voltage is sustained across part 9 of the epitaxial layer 2, between the cathode electrode 4 and the underlying part of the substrate 3. This produces a high electric field above the threshold value in the epitaxial layer 2, so that high-field domains form adjacent the cathode electrode 4 and propagate through part 9 of the epitaxial layer 2 to the substrate 3. The frequency of propagation of these domains is determined by the thickness of the epitaxial layer 2 rather than by the spacing of electrodes 4 and 7. Thus, conventional Gunn effect action occurs in the active region 9 of the epitaxial layer 2, between the cathode electrode 4 and the substrate 3, in spite of the contact between the electrode 7 and the other parts of the epitaxial layer 2, and the device performs as a so-called longitudinal Gunn effect device even though it has both cathode and anode electrodes 4 and 7 at the same major surface 8 of the body 1.

In a typical case, the area of contact between the anode electrode 7 and the epitaxial layer 2 is of the same order of magnitude as that between the anode electrode 7 and the substrate 3. In these circumstances current injection from the anode electrode 7 into the underlying epitaxial layer 2 is small due to the relative resistivities of the layer 2 and substrate 3. In a typical case, when the substrate doping is about three orders of magnitude greater than that of the epitaxial layer, such current injection would probably not prove troublesome if the substrate contact area were an order of magnitude smaller than the epitaxial layer contact area with the anode electrode 7. However, in general it would be undesirable to have too large a contact area between the anode electrode 7 and the epitaxial layer 2, since this would require a body 1 having a large area surface 8 and hence reduce the number of devices which could be made from a single wafer of given dimensions. Therefore, preferably the anode electrode contact area with the substrate 3 is larger, the same, or slightly smaller than that with the epitaxial layer 2.

As shown in FIGS. 1 and 2, both the anode and cathode electrodes 4 and 7 may have beam-lead terminations which are present at substantially the same level over the epitaxial layer 2 and protrude from the body 1 across different peripheral portions of the layer 2. Each of the electrodes 4 and 7 may comprise a thin layer 10 of, for example, tin and silver. The layer 10 may have a thickness of, for example, one micron, and is alloyed into the gallium arsenide surface to form the low-ohmic contact. The bulk 11 of the beam-lead electrodes 4 and 7 may be gold electroplated to a thickness of typically 10 to 15 microns.

When the device of FIGS. 1 and 2 is connected in a hybrid micro-wave circuit, the beam-lead terminations are bonded to conductors of the circuit substrate. In operation, heat generated in active region 9, flows through the substrate 3, the cathode electrode 4 and also to a smaller extent through the anode electrode 7.

The device of FIGS. 1 and 2 can be manufactured simply, in the following manner starting with a gallium arsenide wafer comprising the epitaxial layer 2 on the substrate 3. Many such devices are manufactured simultaneously on the same wafer which is subsequently divided by etching to form the individual bodies 1 of each device. The manufacturing steps are as follows.

Apertures 5 are etched through the epitaxial layer 2 of the wafer to expose parts 6 of the substrate 3. Tin and silver are then evaporated successively over the whole surface 8 of the epitaxial layer and the exposed substrate parts 6. These tin and silver layers are alloyed into the underlying wafer surface to make a low-ohmic connection.

A photolithographic mask is then provided in a conventional manner on the alloyed silver-tin. Windows in this mask define the areas where the beam-lead bulk portions 11 are to be formed. Care must be taken to align the window areas corresponding to the contact parts 7*a* of electrode 7 with the apertures 5. However, the large area dimensions of this contact part 7*a* and of the aperture 5 means that this alignment is not difficult to achieve. Using the silver-tin layer as a plating cathode, gold is then electro-deposited at the windows in the photolithographic mask. In this manner, the separate portions 11 are formed, typically to a thickness of 10 to 15 microns. The photolithographic mask is dissolved, and the top surface of the wafer is lightly etched to remove extraneous silver-tin not covered by the plated portions 11. In this manner the separate portions 10 of the electrodes 4 and 7 are formed, and the lateral extent of the cathode contact area is partly defined.

If the substrate is very thick, it may now be thinned by lapping from the back surface. Finally the back surface is selectively masked in alignment with the total device area at front surface 8 and then exposed to etchant to mesa-etch the wafer from the back surface. In this manner, the wafer is divided into separate mesa-shaped bodies 1 having protruding beam-leads 4 and 7. Since the mesa-etch defines the lateral extent of the epitaxial layer 2, it also completes the definition of the contact area between the epitaxial layer 2 and the cathode electrode 4, and completes the definition of the lateral extent of the active region 9 between the cathode electrode 4 and the substrate 3.

Figure 3:
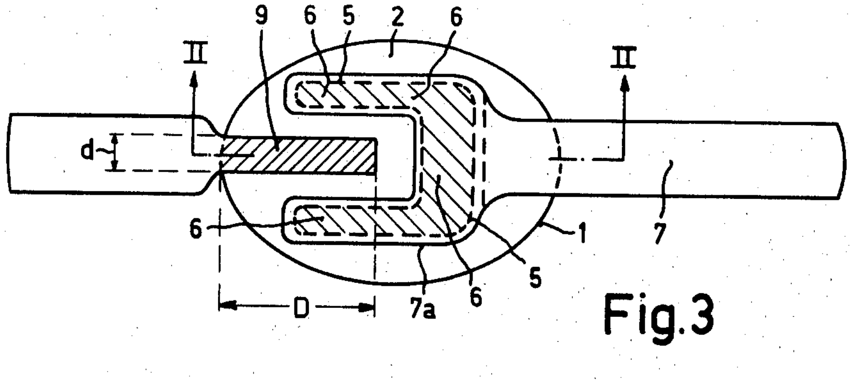
FIG. 3 is a plan view of another beamleaded Gunn effect device in accordance with the present invention.

It will be obvious that many modifications are possible within the scope of the invention. Thus, for example, FIG. 3 shows the plan view of another device which may have a cross-section similar to that of FIG. 2. This device incorporates several modifications compared with FIG. 1, and parts of the device of FIG. 3 corresponding to those of FIG. 1 are designated by the same reference numerals and letters.

Thus, for example, the ohmic contact of the cathode electrode 4 with the epitaxial layer 2 may be shaped to increase the periphery dimension D of active region 9 which results from the edge of the electrode 4 on the layer 2 while reducing periphery dimension *d* at the mesa edge of the body 1 beneath the electrode 4. This can aid in minimising any undesirable mesa-edge effects on the active region 9 in operation and can ease the alignment of the mesa-etch definition in manufacture. An improved D/*d* ratio is shown in FIG. 3, where the active region 9 has an elongate form advantageous for heat dissipation.

The aperture 5 in the layer 2 may have a variety of shapes. Thus, for example, it may be in the form of a segment of a circle with the straight edge of the segment facing the active region 9. Such an aperture 5 is indicated in FIG. 1. It may be part-annular and thus laterally extend partly around the cathode electrode 4 above the active region 9; in this case, the portion 7*a* of the anode electrode 7 in contact with the substrate 3 may also have a part-annular configuration, this can assist in making more uniform heat flow from the active region 9 to the anode electrode 7. Such an arrangement is shown in FIG. 3.

The anode electrode 7 need not cover the whole of the surface 6 of the substrate 3 exposed at the aperture 5 in the epitaxial layer 2. In this case, part of the edge of the aperture 5 where not covered by the anode electrode 7 may be utilized in defining the active region 9 of the device.

Of course, an insulating and passivating layer may be present on the surface 8 and have windows therein at which the aperture 5 and the cathode contact area are exposed.

Instead of using mesa-etching from the back surface, the total device area in the epitaxial layer may be defined by locally masking the front surface 8 and electrodes 4 and 7, and then etching from the front surface.

What is claimed is:

1. A transferred-electron effect semiconductor device which comprises a semiconductor epitaxial layer on a high conductivity semiconductor substrate of the same conductivity type as and of higher conductivity than the epitaxial layer, a first metallic electrode connection to a first part of the major surface of the epitaxial layer remote from the substrate, an active region of the device which is located in the part of the epitaxial layer between said first electrode connection and the substrate and through which the electron flow, in operation, is transverse to the substrate-epitaxial layer interface, characterized in that an aperture is provided in the epitaxial layer extending across the thickness thereof to part of the substrate and in that a second metallic electrode connection is provided on said part of the substrate at the said aperture, said second electrode connection extending on the epitaxial layer on a second part of the said surface of the epitaxial layer and over the edge of the said aperture, in contact with the epitaxial layer, the thickness of the epitaxial layer being less than the smallest distance between the said first and second electrode connection.

2. A semiconductor device as claimed in claim 1 characterized in that both the first and second electrode connections are of the same material(s).

3. A semiconductor device as claimed in claim 2 characterized in that the epitaxial layer and substrate are of n-type gallium-arsenide, and the electrode connections comprise a layer of tin and silver alloyed into the galliumarsenide surface to form low-ohmic contacts to the epitaxial layer and substrate.

4. A semiconductor device as claimed in claim 1, characterized in that the first and second electrode connections include beam-lead terminal portions present at substantially the same level over the epitaxial layer and protruding from the semiconductor body across different peripheral portions of the epitaxial layer.

5. A semiconductor device as claimed in claim 1, characterized in that the area of contact between the second electrode connection and the epitaxial layer is of the same order of magnitude as that between the second electrode connection and the substrate.

6. A semiconductor device as claimed in claim 1, characterized in that the area of contact between the second electrode connection and the substrate is larger than that between the second electrode connection and the epitaxial layer.

7. A semiconductor device as claimed in claim 1, characterized in that the active region formed in the epitaxial layer beneath the first electrode connection is adjacent part of the edge of the epitaxial layer, and the distance over which the first electrode connection extends over the epitaxial layer from the said edge is larger than the length of the said edge beneath the first electrode connection.

8. A semiconductor device as claimed in claim 7, in which the first electrode connection has an strip-shaped form.

9. A semiconductor device as claimed in claim 1, in which both the aperture and the second electrode connection to the substrate laterally extend partly around the active region beneath the first electrode connection.

* * * * *

1050
59)

UNITED STATES PATENT OFFICE

CERTIFICATE OF CORRECTION ent No. 3,836,988 Dated September 17, 1974 ventor(s) KENNETH BOARD

It is certified that error appears in the above-identified patent
d that said Letters Patent are hereby corrected as shown below:

n the title page Section [30] change "Nov. 24, 1973" to-Nov. 24, 1972-- also change "54388/73" to --54388/72--.

Signed and sealed this 17th day of December 1974.

SEAL)
test:

COY M. GIBSON JR.
testing Officer

C. MARSHALL DANN
Commissioner of Patents